United States Patent
Takeda

(10) Patent No.: US 12,520,703 B2
(45) Date of Patent: Jan. 6, 2026

(54) MANUFACTURING METHOD OF DISPLAY DEVICE

(71) Applicant: Magnolia White Corporation, Tokyo (JP)

(72) Inventor: Atsushi Takeda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 377 days.

(21) Appl. No.: 18/313,400

(22) Filed: May 8, 2023

(65) Prior Publication Data

US 2023/0371344 A1 Nov. 16, 2023

(30) Foreign Application Priority Data

May 10, 2022 (JP) .................. 2022-077458

(51) Int. Cl.
*H10K 59/80* (2023.01)
*H10K 71/16* (2023.01)
*H10K 71/20* (2023.01)

(52) U.S. Cl.
CPC .......... *H10K 59/871* (2023.02); *H10K 71/16* (2023.02); *H10K 71/233* (2023.02)

(58) Field of Classification Search
None
See application file for complete search history.

(56) References Cited

U.S. PATENT DOCUMENTS

| | | |
|---|---|---|
| 2004/0160170 A1 | 8/2004 | Sato et al. |
| 2009/0009069 A1 | 1/2009 | Takata |
| 2019/0363275 A1 | 11/2019 | Ochi et al. |
| 2022/0077251 A1 | 3/2022 | Choung et al. |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |
| JP | 2009-32673 A | 2/2009 |
| JP | 2010-118191 A | 5/2010 |
| WO | 2018/179308 A1 | 10/2018 |

*Primary Examiner* — Anthony Ho
(74) *Attorney, Agent, or Firm* — XSENSUS LLP

(57) ABSTRACT

According to an embodiment, a manufacturing method allows the manufacture of a display device including a partition including a lower portion provided on a rib including a pixel aperture and an upper portion protruding from a side surface of the lower portion. The method includes forming a lower electrode, forming a rib layer, forming a lower layer, forming an upper layer, forming a resist, forming the rib by a first etching process, forming the upper portion by a second etching process after the first etching process, and forming the lower portion by a third etching process after the second etching process.

10 Claims, 17 Drawing Sheets

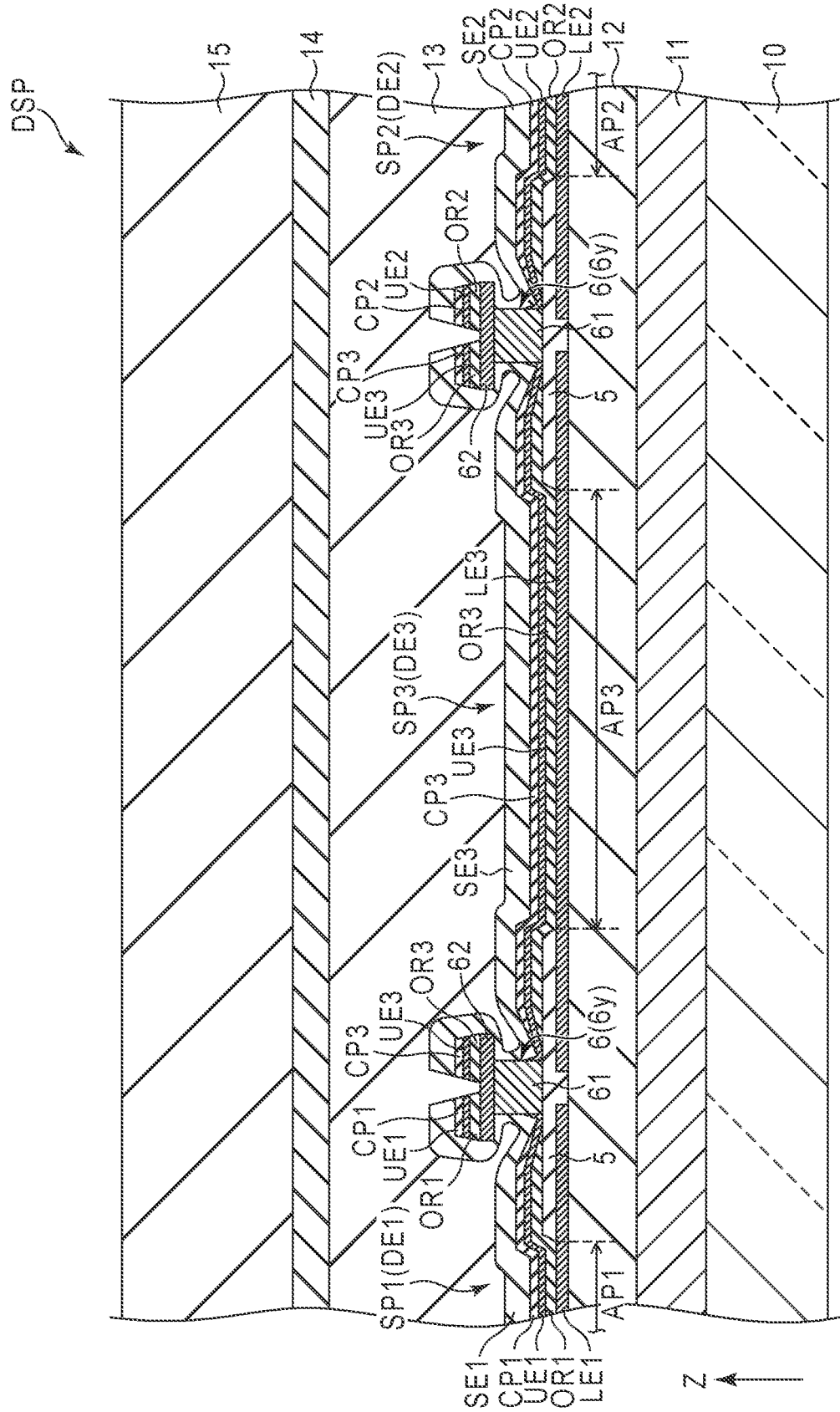
F I G. 4

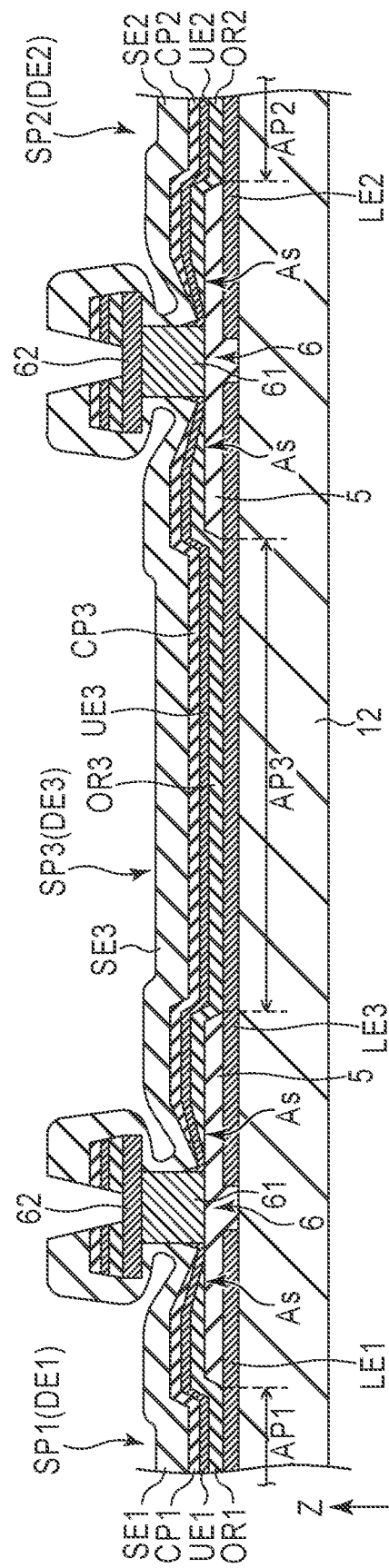
F I G. 8E

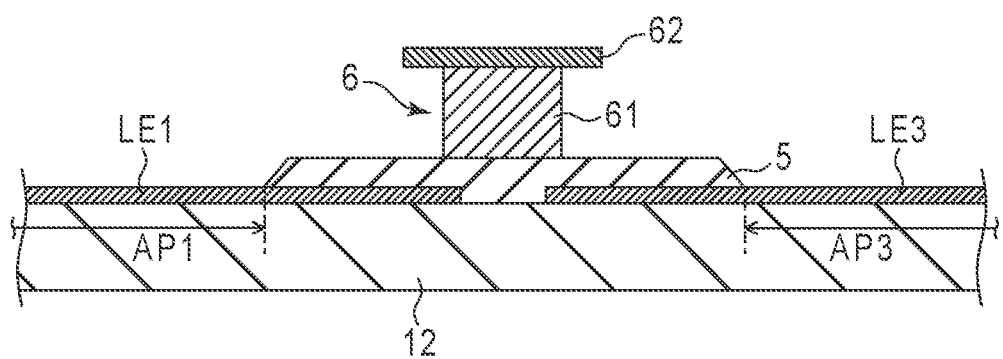
F I G. 12E

MANUFACTURING METHOD OF DISPLAY DEVICE

CROSS-REFERENCE TO RELATED APPLICATIONS

This application is based upon and claims the benefit of priority from Japanese Patent Application No. 2022-077458, filed May 10, 2022, the entire contents of which are incorporated herein by reference.

FIELD

Embodiments described herein relate generally to a manufacturing method of a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

When such a display device is manufactured, a technique which improves the display quality and reliability is required.

BRIEF DESCRIPTION OF THE DRAWINGS

FIG. 4 is a schematic cross-sectional view of the display device according to the first embodiment.

FIG. 8E is a schematic cross-sectional view showing a process following FIG. 8D.

FIG. 12E is a schematic cross-sectional view showing a process following FIG. 12D.

DETAILED DESCRIPTION

Figure 1:
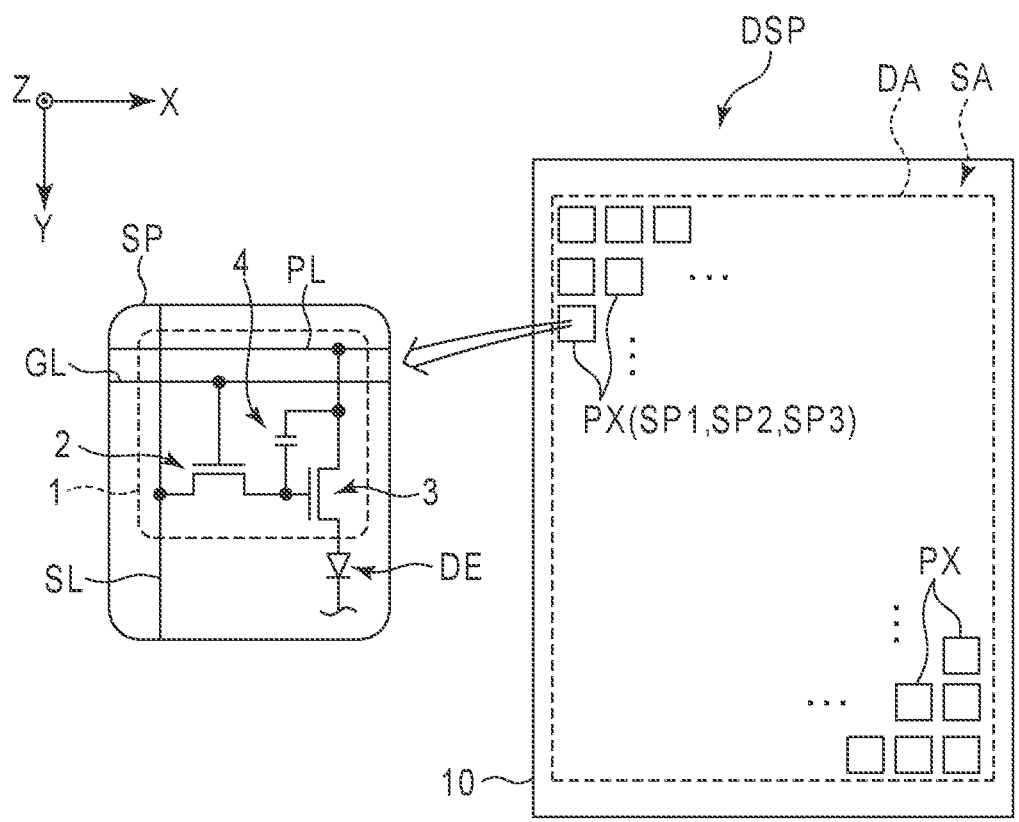
FIG. 1 is a diagram showing a configuration example of a display device according to a first embodiment.

In general, according to one embodiment, a manufacturing method allows the manufacture of a display device comprising a partition including a lower portion and an upper portion, the lower portion being provided on a rib comprising a pixel aperture overlapping a display element, the upper portion protruding from a side surface of the lower portion. The method includes forming a lower electrode of the display element, forming a rib layer formed of a material of the rib on the lower electrode, forming a lower layer formed of a material of the lower portion on the rib layer, forming an upper layer formed of a material of the upper portion on the lower layer, forming a resist on the upper layer, forming the rib comprising the pixel aperture overlapping the lower electrode by removing, of the upper layer, the lower layer and the rib layer, a portion exposed from the resist by a first etching process, forming the upper portion by reducing widths of the resist and the upper layer by a second etching process after the first etching process, and forming the lower portion by making a width of the lower layer less than a width of the upper portion by a third etching process after the second etching process.

This manufacturing method can improve the display quality and reliability of a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various elements are viewed parallel to the third direction Z, the appearance is defined as a plan view.

The display device of each embodiment is an organic electroluminescent (EL) display device comprising an organic light emitting diode (OLED) as a display element, and could be mounted on a television, a personal computer, a vehicle-mounted device, a tablet, a smartphone, a mobile phone, etc.

First Embodiment

FIG. 1 is a diagram showing a configuration example of a display device DSP according to a first embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a red subpixel SP1, a green subpixel SP2 and a blue subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE. The display element DE is an organic light emitting diode (OLED) as a light emitting element.

It should be noted that the configuration of the pixel circuit 1 is not limited to the example shown in the figure. For example, the pixel circuit 1 may comprise more thin-film transistors and capacitors.

Figure 2:
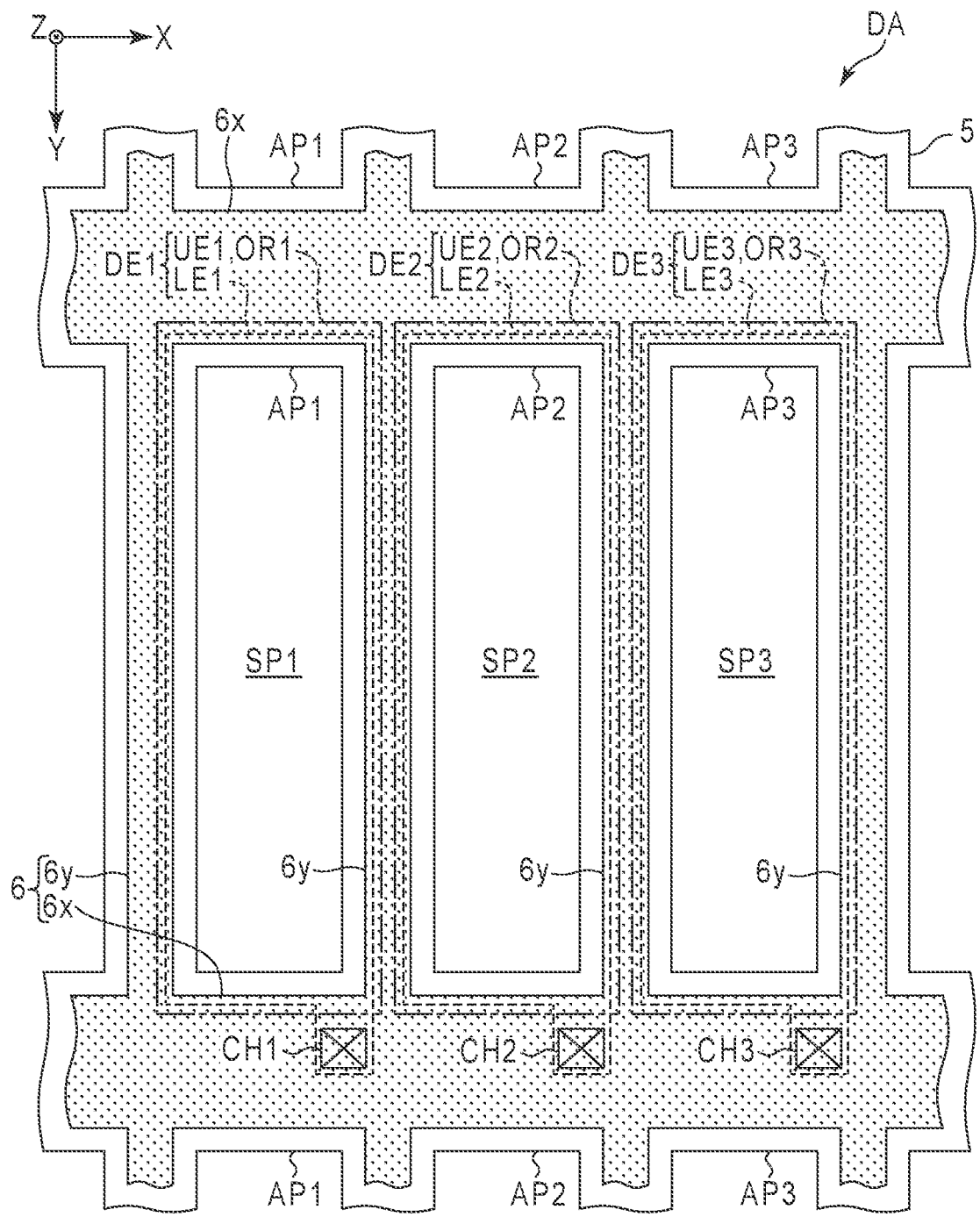
FIG. 2 is a diagram showing an example of the layout of subpixels.

FIG. 2 is a diagram showing an example of the layout of subpixels SP1, SP2 and SP3 which constitute a pixel PX. In the example of FIG. 2, subpixels SP1, SP2 and SP3 are arranged in order in the first direction X.

When subpixels SP1, SP2 and SP3 are provided in line with this layout in each pixel PX, in the display area DA, a column in which a plurality of subpixels SP1 are provided in the second direction Y, a column in which a plurality of subpixels SP2 are provided in the second direction Y and a column in which a plurality of subpixels SP3 are provided in the second direction Y are formed. These columns are arranged in order in the first direction X.

A rib 5 and a partition 6 are provided in the display area DA. The rib 5 comprises a pixel aperture AP1 in subpixel SP1, comprises a pixel aperture AP2 in subpixel SP2 and comprises a pixel aperture AP3 in subpixel SP3. In the example of FIG. 2, each of the pixel apertures AP1, AP2 and AP3 has a rectangular shape which is long in the second direction Y.

The partition 6 is provided in the boundary of adjacent subpixels SP1, SP2 and SP3 and overlaps the rib 5 as seen in plan view. The partition 6 comprises a plurality of first partitions 6x extending in the first direction X and a plurality of second partitions 6y extending in the second direction Y.

In the example of FIG. 2, the first partitions 6x and the second partitions 6y are connected to each other. In this configuration, the partition 6 has a grating shape surrounding the pixel apertures AP1, AP2 and AP3 as a whole. In other words, the partition 6 comprises apertures in subpixels SP1, SP2 and SP3 in a manner similar to that of the rib 5.

Subpixel SP1 comprises a lower electrode LE1, an upper electrode UE1 and an organic layer OR1 overlapping the pixel aperture AP1. Subpixel SP2 comprises a lower electrode LE2, an upper electrode UE2 and an organic layer OR2 overlapping the pixel aperture AP2. Subpixel SP3 comprises a lower electrode LE3, an upper electrode UE3 and an organic layer OR3 overlapping the pixel aperture AP3.

The lower electrode LE1, the upper electrode UE1 and the organic layer OR1 constitute the display element DE1 of subpixel SP1. The lower electrode LE2, the upper electrode UE2 and the organic layer OR2 constitute the display element DE2 of subpixel SP2. The lower electrode LE3, the upper electrode UE3 and the organic layer OR3 constitute the display element DE3 of subpixel SP3. Each of the display elements DE1, DE2 and DE3 may include a cap layer as described later.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3. In the example of FIG. 2, the contact holes CH1, CH2 and CH3 overlap the first partition 6x as a whole.

Figure 3:
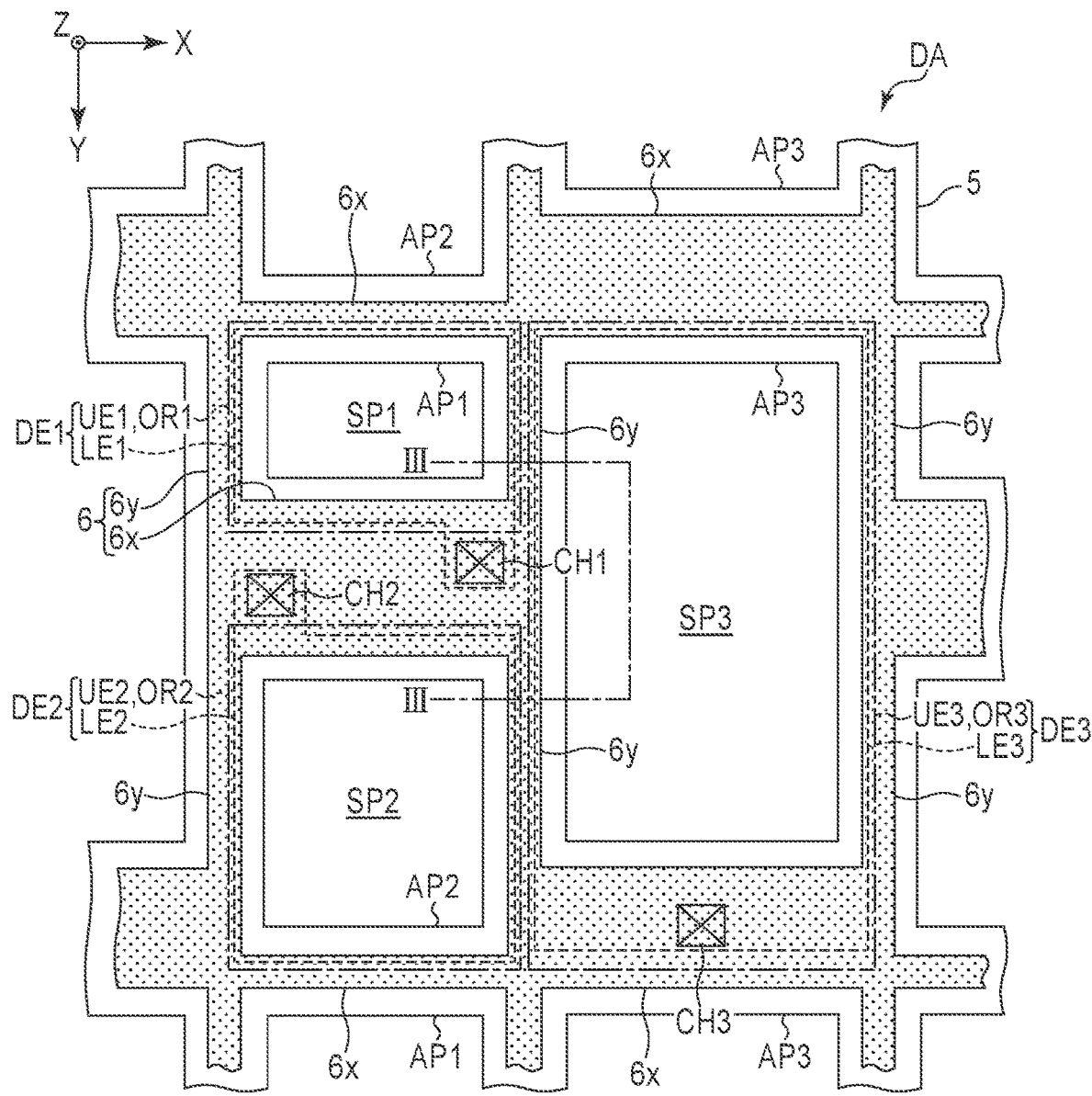
FIG. 3 is a diagram showing another example of the layout of subpixels.

FIG. 3 is a diagram showing another example of the layout of subpixels SP1, SP2 and SP3. In the example of FIG. 3, subpixels SP1 and SP3 are arranged in the first direction X. Subpixels SP2 and SP3 are also arranged in the first direction X. Further, subpixels SP1 and SP2 are arranged in the second direction Y. The pixel aperture AP2 is larger than the pixel aperture AP1. The pixel aperture AP3 is larger than the pixel aperture AP2.

When subpixels SP1, SP2 and SP3 are provided in line with this layout, in the display area DA, a column in which subpixels SP1 and SP2 are alternately provided in the second direction Y and a column in which a plurality of subpixels SP3 are repeatedly provided in the second direction Y are formed. These columns are alternately arranged in the first direction X.

In the example of FIG. 3, the contact holes CH1 and CH2 entirely overlap the first partition 6X between the pixel apertures AP1 and AP2 which are adjacent to each other in the second direction Y. The contact hole CH3 entirely overlaps the first partition 6x between two pixel apertures AP3 which are adjacent to each other in the second direction Y.

FIG. 4 is a schematic cross-sectional view of the display device DSP. This cross-sectional view corresponds to, for example, the cross-sectional view taken along the III-III line of FIG. 3. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an organic insulating layer 12. The organic insulating layer 12 functions as a planarization film which planarizes the irregularities formed by the circuit layer 11. Although not shown in the section of FIG. 4, all of the contact holes CH1, CH2 and CH3 described above are provided in the organic insulating layer 12.

The lower electrodes LE1, LE2 and LE3 are provided on the organic insulating layer 12. The rib 5 is provided on the organic insulating layer 12 and the lower electrodes LE1, LE2 and LE3 and comprises the pixel apertures AP1, AP2 and AP3 described above. The lower electrodes LE1, LE2 and LE3 are partly covered with the rib 5.

The partition 6 includes a conductive lower portion 61 provided on the rib 5 and an upper portion 62 provided on the lower portion 61. The upper portion 62 has a width greater than that of the lower portion 61. By this configuration, in FIG. 4, the both end portions of the upper portion 62 protrude relative to the side surfaces of the lower portion 61. This shape of the partition 6 may be called an overhang shape.

The organic layer OR1 covers the lower electrode LE1. The upper electrode UE1 covers the organic layer OR1 and faces the lower electrode LE1. The organic layer OR2 covers the lower electrode LE2. The upper electrode UE2 covers the organic layer OR2 and faces the lower electrode LE2. The organic layer OR3 covers the lower electrode LE3. The upper electrode UE3 covers the organic layer OR3 and faces the lower electrode LE3.

In the example of FIG. 4, a cap layer CP1 is provided on the upper electrode UE1. A cap layer CP2 is provided on the upper electrode UE2. A cap layer CP3 is provided on the upper electrode UE3. The cap layers CP1, CP2 and CP3 adjust the optical property of the light emitted from the organic layers OR1, OR2 and OR3, respectively.

The organic layer OR1, the upper electrode UE1 and the cap layer CP1 are partly located on the upper portion 62. These portions are spaced apart from the other portions of the organic layer OR1, the upper electrode UE1 and the cap layer CP1 (in other words, the portion which constitutes the display element DE1). Similarly, the organic layer OR2, the upper electrode UE2 and the cap layer CP2 are partly located on the upper portion 62, and these portions are spaced apart from the other portions of the organic layer OR2, the upper electrode UE2 and the cap layer CP2 (in other words, the portion which constitutes the display element DE2). Further, the organic layer OR3, the upper electrode UE3 and the cap layer CP3 are partly located on the upper portion 62, and these portions are spaced apart from the other portions of the organic layer OR3, the upper electrode UE3 and the cap layer CP3 (in other words, the portion which constitutes the display element DE3).

A sealing layer SE1 is provided in subpixel SP1. A sealing layer SE2 is provided in subpixel SP2. A sealing layer SE3 is provided in subpixel SP3. The sealing layer SE1 continuously covers the cap layer CP1 and the partition 6 around subpixel SP1. The sealing layer SE2 continuously covers the cap layer CP2 and the partition 6 around subpixel SP2. The sealing layer SE3 continuously covers the cap layer CP3 and the partition 6 around subpixel SP3.

The end portions of the sealing layers SE1, SE2 and SE3 are located above the upper portions 62. In the example of FIG. 4, the organic layer OR1, the upper electrode UE1, the cap layer CP1 and the sealing layer SE1 located on the upper portion 62 of the left partition 6 are spaced apart from the organic layer OR3, the upper electrode UE3, the cap layer CP3 and the sealing layer SE3 located on this upper portion 62. The organic layer OR2, the upper electrode UE2, the cap layer CP2 and the sealing layer SE2 located on the upper portion 62 of the right partition 6 are spaced apart from the organic layer OR3, the upper electrode UE3, the cap layer CP3 and the sealing layer SE3 located on this upper portion 62.

The sealing layers SE1, SE2 and SE3 are covered with a resin layer 13. The resin layer 13 is covered with a sealing layer 14. Further, the sealing layer 14 is covered with a resin layer 15.

Each of the organic insulating layer 12 and the resin layers 13 and 15 is formed of an organic material. Each of the rib 5 and the sealing layers 14, SE1, SE2 and SE3 is formed of, for example, an inorganic material such as silicon nitride (SiN), silicon oxide (SiO) or silicon oxynitride (SiON).

Each of the lower electrodes LE1, LE2 and LE3 comprises an intermediate layer formed of, for example, silver (Ag), and a pair of conductive oxide layers covering the upper and lower surfaces of the intermediate layer. Each conductive oxide layer may be formed of, for example, a transparent conductive oxide such as indium tin oxide (ITO), indium zinc oxide (IZO) or indium gallium zinc oxide (IGZO).

Each of the upper electrodes UE1, UE2 and UE3 is formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer.

Each of the cap layers CP1, CP2 and CP3 is formed by, for example, a multilayer body consisting of a plurality of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CP1, CP2 and CP3 may be omitted.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer of the organic layer OR1 emits light in a red wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a blue wavelength range.

Figure 5:
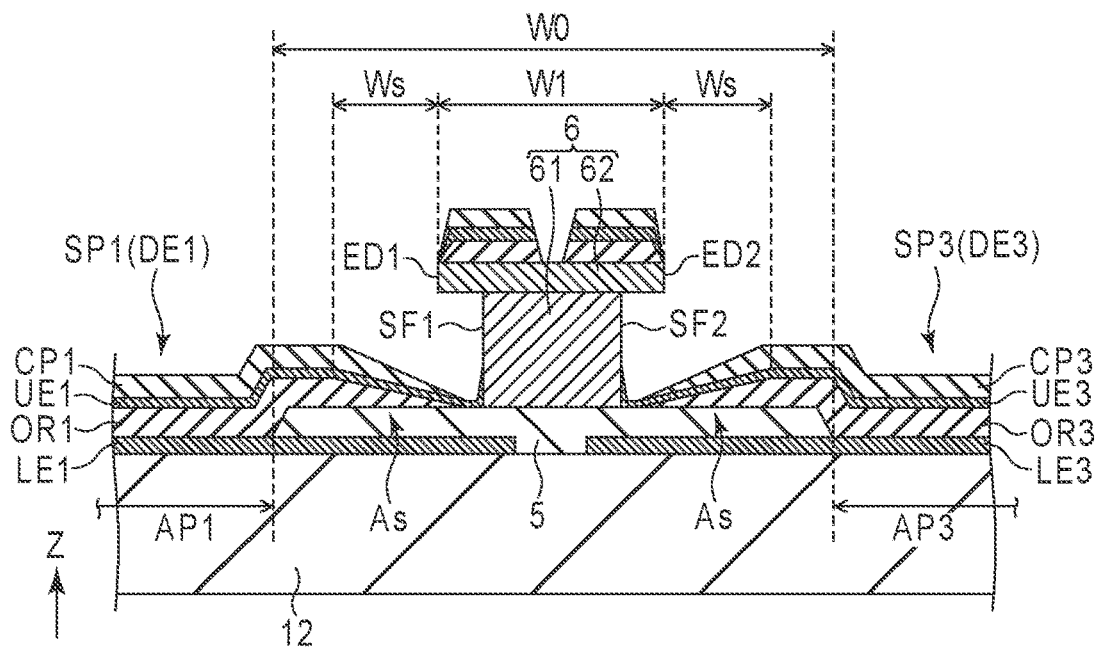
FIG. 5 is a diagram showing an example of a structure which could be applied to a partition and its vicinity according to the first embodiment.

FIG. 5 is a diagram showing an example of a structure which could be applied to the partition 6 and its vicinity. This figure shows, of the partition 6, the portion located between subpixels SP1 and SP3. It should be noted that a similar configuration can be applied to, of the partition 6, the portion located between subpixels SP1 and SP2 and the portion located between subpixels SP2 and SP3.

The lower portion 61 comprises side surfaces SF1 and SF2. The upper portion 62 comprises end portions ED1 and ED2 which protrude from the side surfaces SF1 and SF2, respectively. The upper electrodes UE1 and UE3 are in contact with the side surfaces SF1 and SF2 under the end portions ED1 and ED2, respectively. In the example of FIG. 5, the side surfaces SF1 and SF2 are substantially parallel to a third direction Z. As another example, the side surfaces SF1 and SF2 may incline with respect to the third direction Z such that the lower portion 61 tapers toward the upper side.

The lower portion 61 may be formed of, for example, aluminum (Al). The lower portion 61 may be formed of an aluminum alloy such as an aluminum-neodymium alloy (AlNd) or may comprise a multilayer structure consisting of aluminum and an aluminum alloy. The lower portion 61 may comprise a multilayer structure consisting of a thin first metal layer formed of molybdenum (Mo), etc., and a thick second metal layer formed of aluminum or an aluminum alloy.

The upper portion 62 may be formed of, for example, titanium (Ti) or silicon oxide. The upper portion 62 may comprise a multilayer structure consisting of a first thin film formed of titanium or silicon oxide and a second thin film which covers the first thin film. The second thin film may be formed of, for example, a conductive oxide such as ITO, IZO or IGZO.

The upper portion 62 is formed so as to be thinner than the lower portion 61. For example, the thickness of the lower portion 61 is approximately 1000 nm, and the thickness of the upper portion 62 is approximately 200 nm.

The organic layers OR1, OR2 and OR3, the upper electrodes UE1, UE2 and UE3 and the cap layers CP1, CP2 and CP3 are formed by vapor deposition. Regarding this vapor deposition, a shadow area As which is the shadow of the partition 6 is formed on the upper side of the rib 5. The organic layers OR1, OR2 and OR3, the upper electrodes UE1, UE2 and UE3 and the cap layers CP1, CP2 and CP3 in the shadow area As are thinner than those in the other area.

In the shadow area As near the side surface SF1 shown in FIG. 5, the thicknesses of the organic layer OR1, the upper electrode UE1 and the cap layer CP1 decrease toward the side surface SF1. In the shadow area As near the side surface SF2, the thicknesses of the organic layer OR3, the upper electrode UE3 and the cap layer CP3 decrease toward the side surface SF2.

As shown in FIG. 5, the width of the rib 5 in the width direction of the partition 6 (in other words, a direction orthogonal to the third direction Z) is defined as W0. The width of the partition 6 is defined as W1. The width of the shadow area As is defined as Ws. Width W1 is equivalent to the distance between the end portions ED1 and ED2 of the upper portion 62. Width Ws is equivalent to the distance in plan view between the upper portion 62 and the position at which the thicknesses of the organic layer OR1, OR2 or OR3, the upper electrode UE1, UE2 or UE3 and the cap layer CP1, CP2 or CP3 start to decrease on the rib 5.

If the shadow area As overlaps the pixel aperture AP1, AP2 or AP3, the current density in the overlapping portion is increased, and the degradation of the display element DE1, DE2 or DE3 is accelerated. Therefore, the width W0 of the rib 5 needs to be determined such that the shadow area As does not overlap the pixel aperture AP1, AP2 or AP3. Specifically, width W0 is determined so as to satisfy the following condition (1).

$$W0 \geq W1 + Ws \times 2 \tag{1}$$

Now, this specification explains the manufacturing method of the display device DSP.

Figure 6:
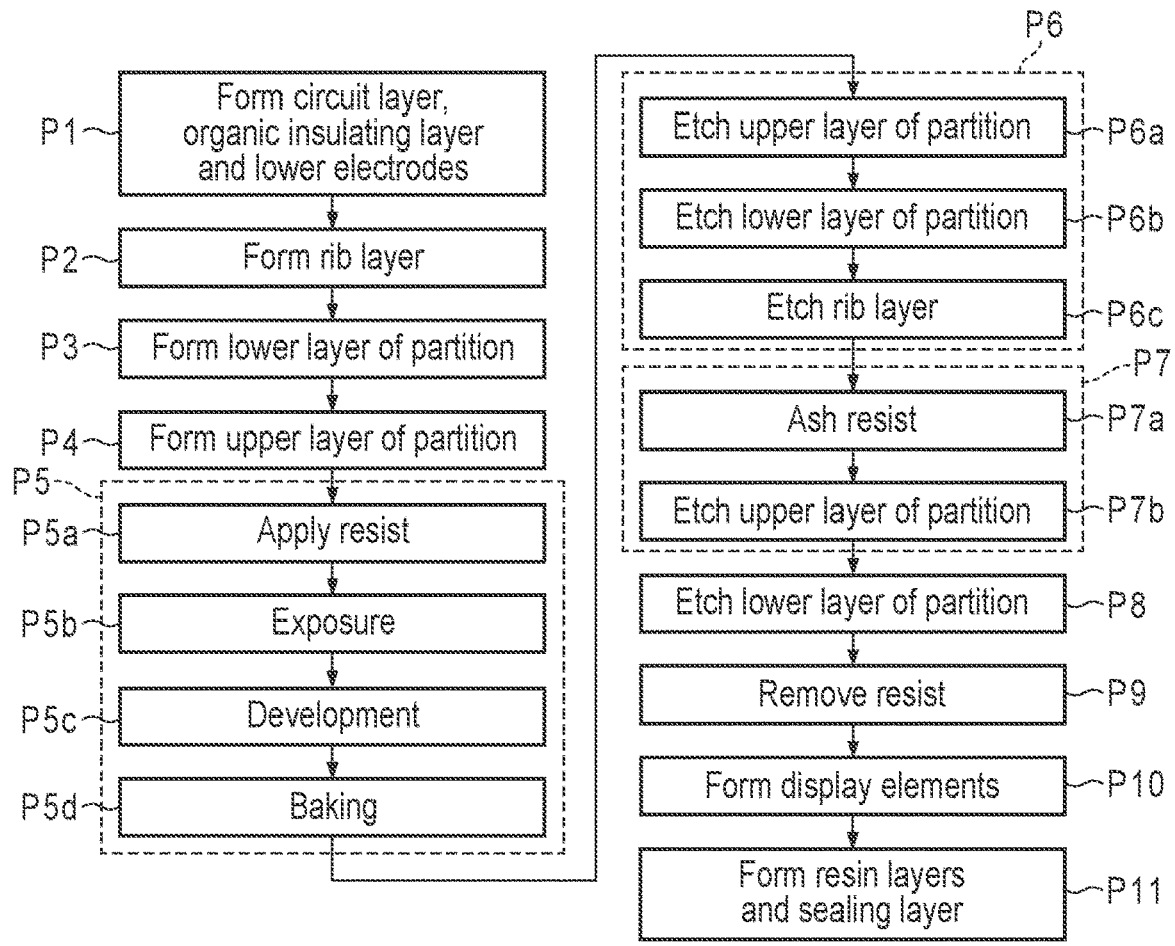
FIG. 6 is the flowchart of the manufacturing method of the display device according to the first embodiment.

FIG. 6 is the flowchart of the manufacturing method of the display device DSP according to the present embodiment. FIG. 7A to FIG. 7F are schematic cross-sectional views showing a process for forming the rib 5 and the partition 6. FIG. 8A to FIG. 8E are schematic cross-sectional views showing a process for forming the display elements DE1, DE2 and DE3.

To manufacture the display device DSP, first, the circuit layer 11 is formed on the substrate 10, and the organic insulating layer 12 is formed on the circuit layer 11, and the lower electrodes LE1, LE2 and LE3 are formed on the organic insulating layer 12 (process P1).

Figure 7A:
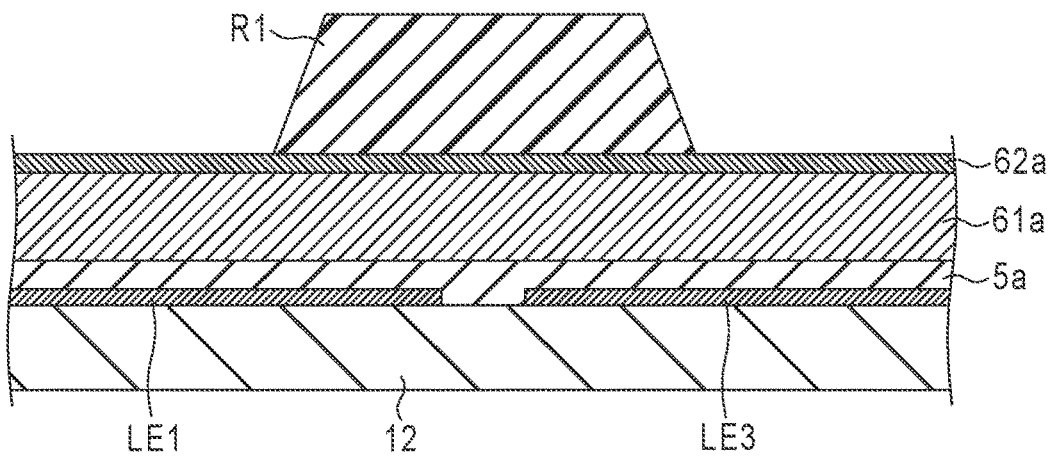
FIG. 7A is a schematic cross-sectional view showing a process for forming a rib and the partition according to the first embodiment.

Subsequently, as shown in FIG. 7A, a rib layer 5a is formed on the organic insulating layer 12 and the lower electrodes LE1, LE2 and LE3 (process P2). A lower layer 61a is formed on the rib layer 5a (process P3). An upper layer 62a is formed on the lower layer 61a (process P4). A resist R1 is formed on the upper layer 62a (process P5).

The rib layer 5a is a layer which is the base of the rib 5, and is formed of the material of the rib 5. The lower layer 61a is a layer which is the base of the lower portion 61 of the partition 6, and is formed of the material of the lower portion 61. The upper layer 62a is a layer which is the base of the upper portion 62 of the partition 6, and is formed of the material of the upper portion 62.

The process P5 of forming the resist R1 includes, as shown in FIG. 6, the process P5a of applying a resist material to the entire substrate, the process P5b of exposing the applied resist material, the process P5c of developing the resist material, and the process P5d of baking the developed resist material. Through these processes P5a, P5b, P5c and P5d, the resist R1 having the same planar shape as the rib 5 shown in FIG. 2 and FIG. 3 is formed.

Figure 7B:
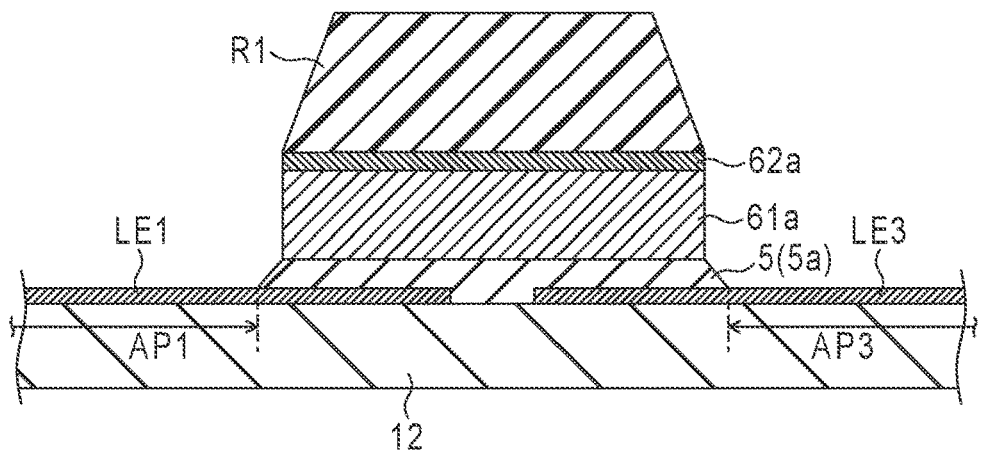
FIG. 7B is a schematic cross-sectional view showing a process following FIG. 7A.

Subsequently, a first etching process P6 is performed. In the first etching process P6, as shown in FIG. 7B, of the upper layer 62a, the lower layer 61a and the rib layer 5a, the portions exposed from the resist R1 are removed. By this process, the rib 5 comprising the pixel apertures AP1, AP2 and AP3 overlapping the lower electrodes LE1, LE2 and LE3 is formed.

As shown in FIG. 6, the first etching process P6 includes first dry etching P6a for removing, of the upper layer 62a, the portion exposed from the resist R1, second dry etching P6b for removing, of the lower layer 61a, the portion exposed from the resist R1, and third dry etching P6c for removing, of the rib layer 5a, the portion exposed from the resist R1. It should be noted that, instead of dry etching, wet etching may be applied to pattern at least one of the upper layer 62a, the lower layer 61a and the rib layer 5a.

When the upper layer 62a and the lower layer 61a can be etched on the condition that the etch selectivity is less, the upper layer 62a and the lower layer 61a may be patterned together by one etching process. Similarly, when the lower layer 61a and the rib layer 5a can be etched on the condition that the etch selectivity is less, the lower layer 61a and the rib layer 5a may be patterned together by one etching process. Further, the upper layer 62a, the lower layer 61a and the rib layer 5a may be patterned together by one etching process.

After the first etching process P6, a second etching process P7 for reducing the widths of the resist R1 and the upper layer 62a is performed. In the present embodiment, the second etching process P7 includes the ashing Pla of the resist R1, and fourth dry etching P7b for the upper layer 62a.

Figure 7C:
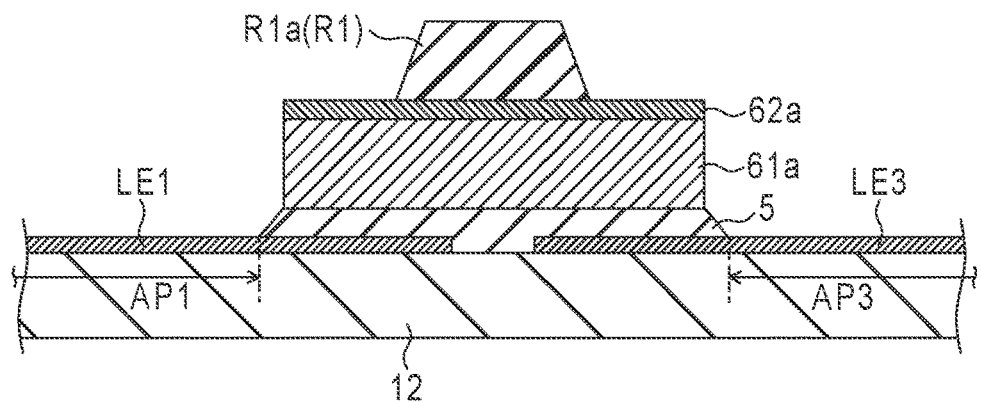
FIG. 7C is a schematic cross-sectional view showing a process following FIG. 7B.

In the ashing Pla, as shown in FIG. 7C, the resist R1 corrodes as a whole. In this way, the height and width of the resist R1 are reduced. For example, before the ashing Pa, the height of the resist R1 is approximately 2.0 μm. After the ashing Pa, the height is decreased to two thirds or less, for example, approximately 1.2 μm. The amount of reduction of the width of the resist R1 by the ashing P7a is greater than or equal to at least twice the width Ws of the shadow area As described above. Hereinafter, the resist R1 which underwent the ashing Pla is referred to as a resist R1a.

Figure 7D:
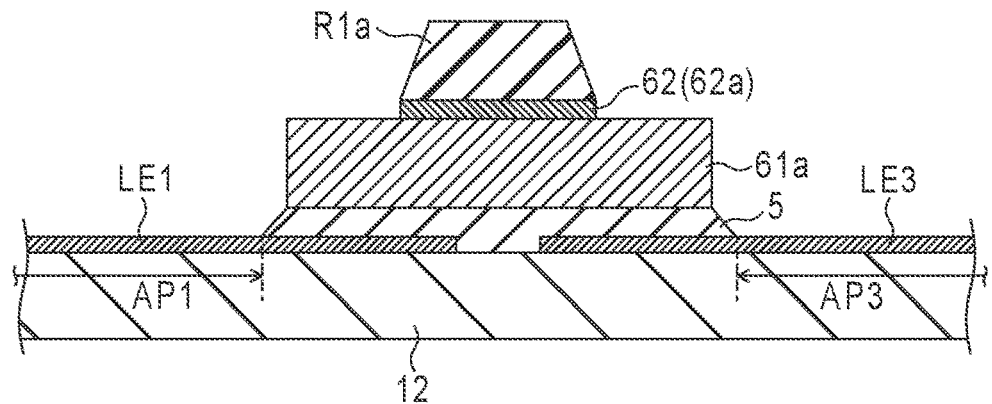
FIG. 7D is a schematic cross-sectional view showing a process following FIG. 7C.

In the fourth dry etching P7b, as shown in FIG. 7D, of the upper layer 62a, the portion exposed from the resist R1a is removed. By this process, the upper portion 62 of the partition 6 is formed.

Figure 7E:
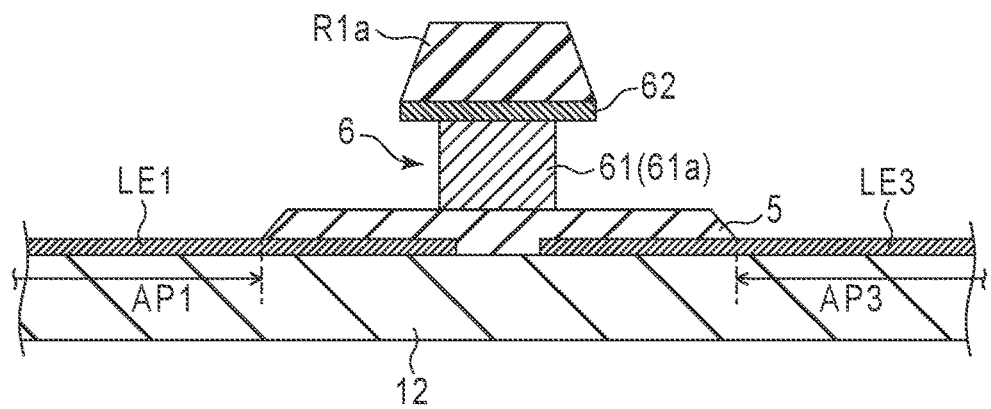
FIG. 7E is a schematic cross-sectional view showing a process following FIG. 7D.

After the second etching process P7, a third etching process P8 is performed. The third etching process P8 includes isotropic wet etching for the lower layer 61a. By this wet etching, as shown in FIG. 7E, the width of the lower layer 61a is made less than that of the upper portion 62, thereby forming the lower portion 61 of the partition 6.

Figure 7F:
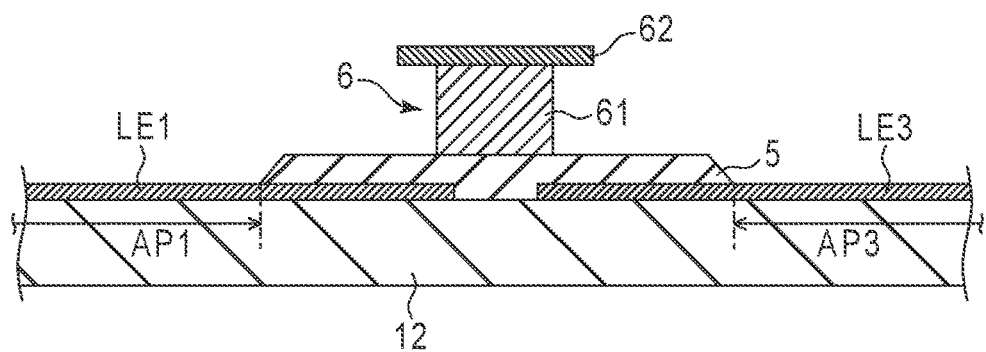
FIG. 7F is a schematic cross-sectional view showing a process following FIG. 7E.

After the rib 5 and the partition 6 are formed using the resist R1 (resist R1a) as described above, the resist R1a is removed by an exfoliation liquid as shown in FIG. 7F (process P9).

Subsequently, the display elements DE1, DE2 and DE3 are formed (process P10). In the present embodiment, for example, this specification assumes a case where the display element DE3 is formed firstly, and the display element DE2 is formed secondly, and the display element DE1 is formed lastly. It should be noted that the formation order of the display elements DE1, DE2 and DE3 is not limited to this example.

Figure 8A:
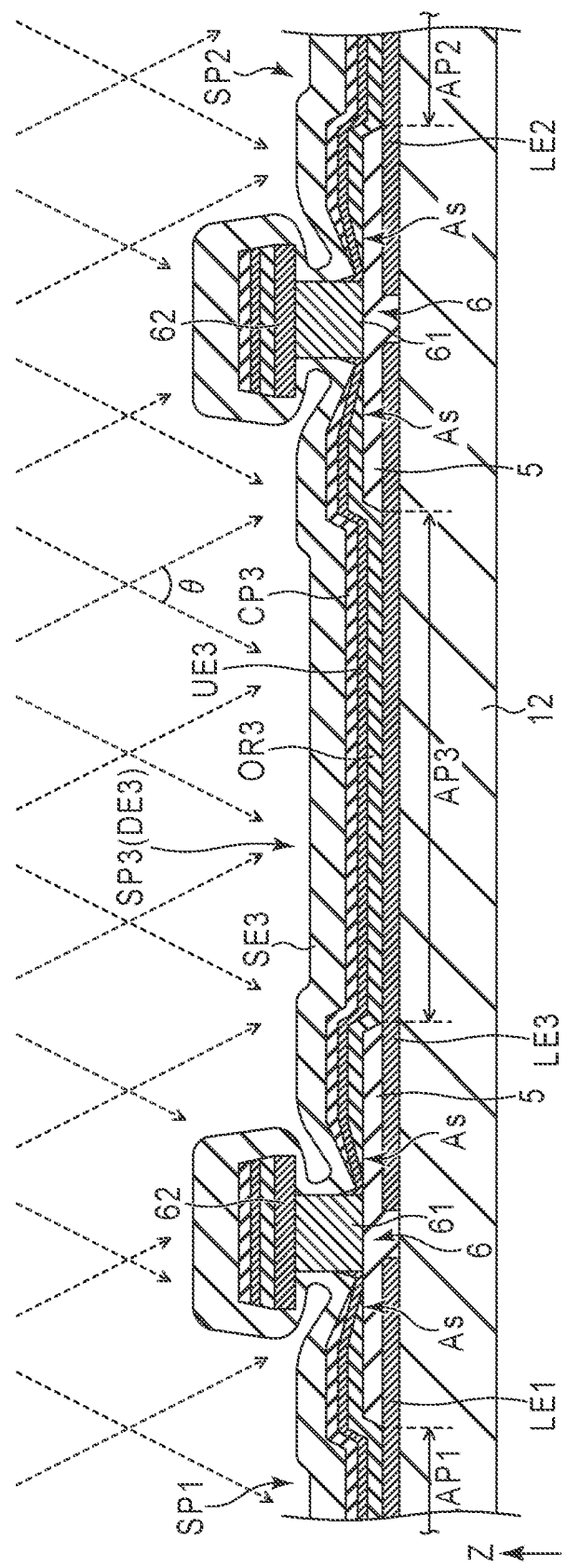
FIG. 8A is a schematic cross-sectional view showing a process for forming a display element.

To form the display element DE3, first, as shown in FIG. 8A, the organic layer OR3, the upper electrode UE3, the cap layer CP3 and the sealing layer SE3 are formed in order by vapor deposition for the entire substrate. At this time, the organic layer OR3, the upper electrode UE3 and the cap layer CP3 formed in subpixels SP1, SP2 and SP3 are divided by the partition 6 having an overhang shape. The sealing layer SE3 continuously covers the display element DE3 including the lower electrode LE3, the organic layer OR3, the upper electrode UE3 and the cap layer CP3 and the partition 6.

Regarding the vapor deposition of the organic layer OR3, the upper electrode UE3 and the cap layer CP3, the materials of these elements are emitted from an evaporation source at a predetermined spread angle θ. Thus, near the partition 6, the shadow area As in which the amount of deposition of these materials is less is formed as described above.

Figure 8B:
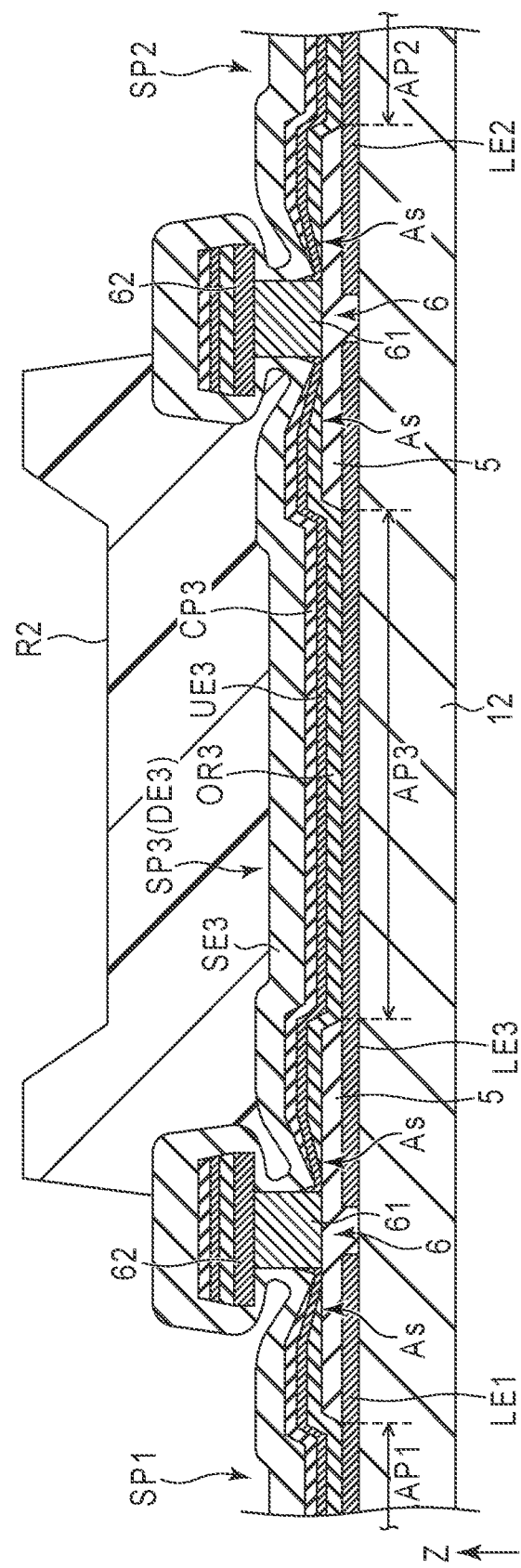
FIG. 8B is a schematic cross-sectional view showing a process following FIG. 8A.

Subsequently, as shown in FIG. 8B, a resist R2 is provided on the sealing layer SE3. The resist R2 has been patterned so as to overlap subpixel SP3. The resist R2 is also located above, of the partition 6 surrounding subpixel SP3, a portion which is close to subpixel SP3.

Figure 8C:
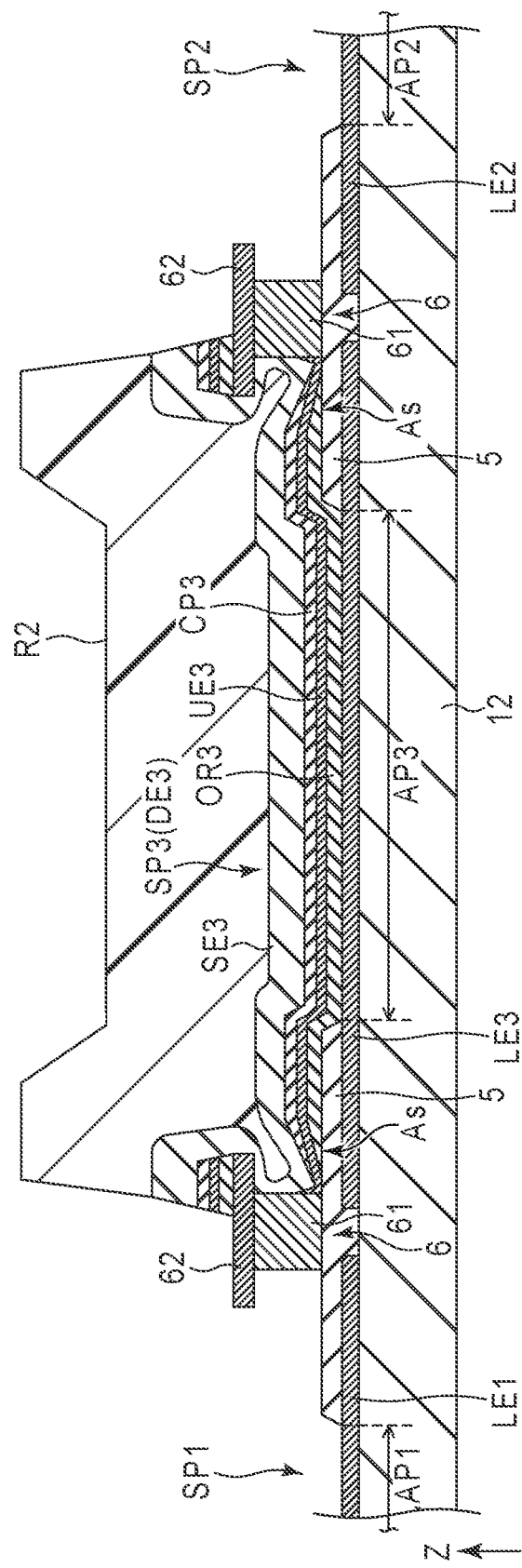
FIG. 8C is a schematic cross-sectional view showing a process following FIG. 8B.

Further, of the organic layer OR3, the upper electrode UE3, the cap layer CP3 and the sealing layer SE3, the portions exposed from the resist R2 are removed as shown in FIG. 8C by etching using the resist R2 as a mask. This process enables the acquisition of the following substrate. In subpixel SP3, the display element DE3 including the lower electrode LE3, the organic layer OR3, the upper electrode UE3 and the cap layer CP3 is formed, and the sealing layer SE3 which covers the display element DE3 is also formed. No display element or sealing layer is formed in subpixel SP1 or SP2.

The etching in the process of FIG. 8C includes, for example, dry etching for the sealing layer SE3, wet etching or ashing for the cap layer CP3, wet etching for the upper electrode UE3 and ashing for the organic layer OR3.

Figure 8D:
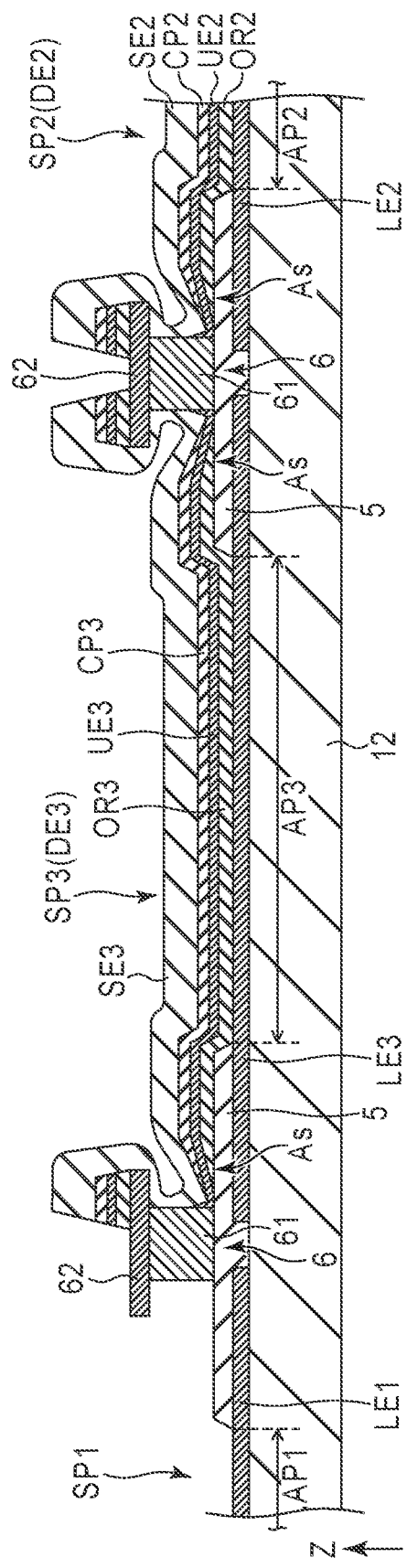
FIG. 8D is a schematic cross-sectional view showing a process following FIG. 8C.

Subsequently, the resist R2 is removed, and a process for forming the display element DE2 in subpixel SP2 is performed by a procedure similar to that of the display element DE3. This process enables the acquisition of the following substrate. As shown in FIG. 8D, further, in subpixel SP2, the display element DE2 including the lower electrode LE2, the organic layer OR2, the upper electrode UE2 and the cap layer CP2 is formed, and the sealing layer SE2 which covers the display element DE2 is also formed.

After the formation of the display element DE2, a process for forming the display element DE1 in subpixel SP1 is performed by a procedure similar to that of the display element DE3. This process enables the acquisition of the following substrate. As shown in FIG. 8E, further, in subpixel SP1, the display element DE1 including the lower electrode LE1, the organic layer OR1, the upper electrode UE1 and the cap layer CP1 is formed, and the sealing layer SE1 which covers the display element DE1 is also formed.

After the formation of the display elements DE1, DE2 and DE3, the processes of forming the resin layer 13, the sealing layer 14 and the resin layer 15 are performed in order (process P11). In this way, the display device DSP comprising the structure shown in FIG. 4 is completed.

The effects obtained by the display device DSP and the manufacturing method thereof in the present embodiment described above are explained with reference to FIG. 9 and FIG. 10.

Figure 9:
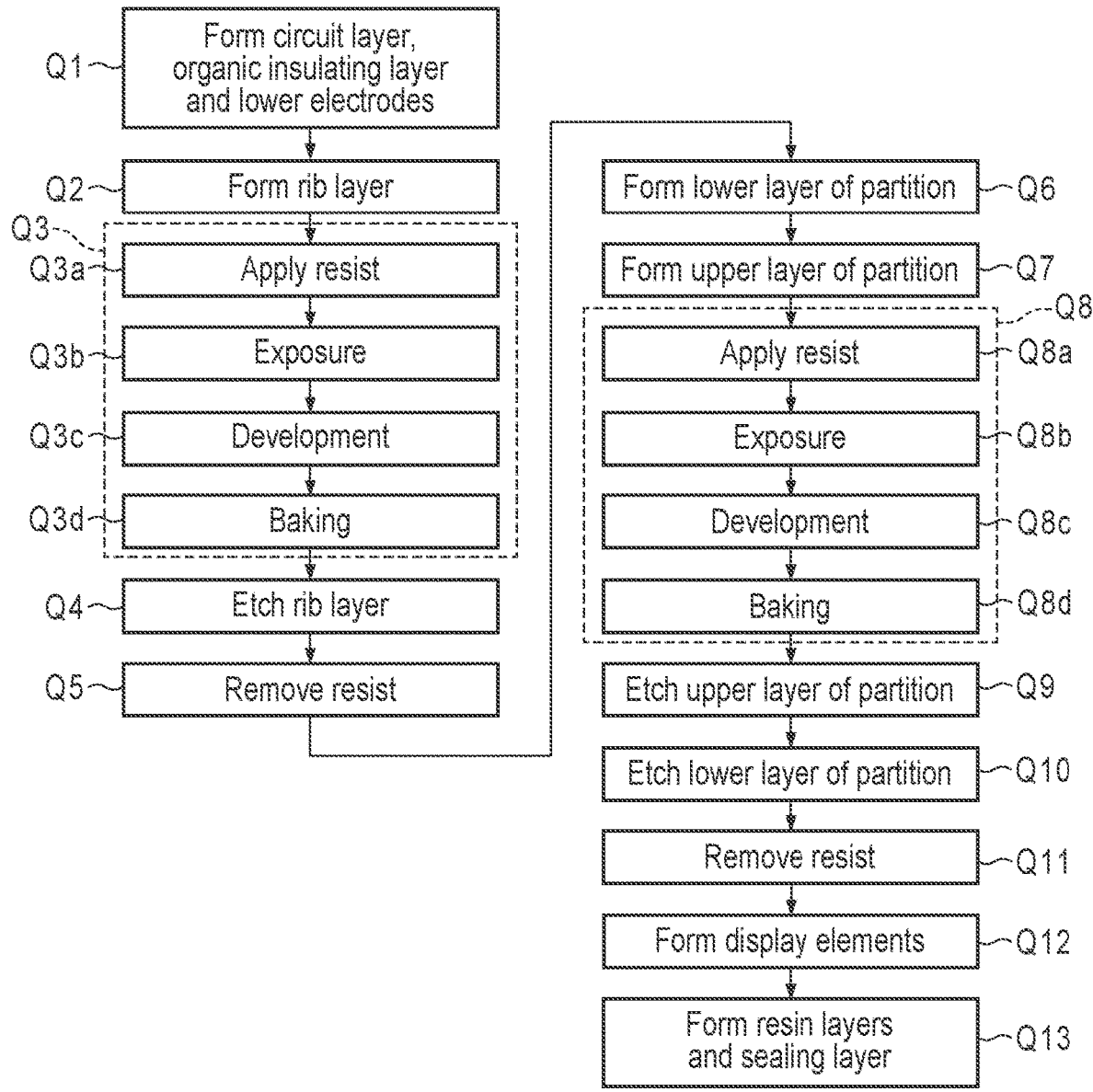
FIG. 9 is a flowchart showing a manufacturing method according to a comparative example.

FIG. 9 is a flowchart showing a manufacturing method according to a comparative example of the present embodiment. In this manufacturing method, first, the circuit layer 11, the organic insulating layer 12 and the lower electrodes LE1, LE2 and LE3 are formed (process Q1).

Subsequently, the rib layer 5a is formed (process Q2), and a first resist is formed on the rib layer 5a (process Q3). The process Q3 of forming the first resist includes the process Q3 of applying a resist material to the upper side of the rib layer 5a, the process Q3b of exposing the resist material, the process Q3c of developing the exposed resist material and the process Q3d of baking the developed resist material. In this way, the first resist having the same planar shape as the rib 5 is formed. After the formation of the first resist, of the rib layer 5a, the portion exposed from the first resist is removed by etching (process Q4). The rib 5 comprising the pixel apertures AP1, AP2 and AP3 is formed. Subsequently, the first resist is removed (process Q5).

Subsequently, the lower layer 61a which covers the rib 5 is formed (process Q6). The upper layer 62a which covers the lower layer 61a is formed (process Q7). Further, a second resist is formed on the upper layer 62a (process Q8). The process Q8 of forming the second resist includes the process Q8a of applying a resist material to the upper side of the upper layer 62a, the process Q8b of exposing the resist material, the process Q8c of developing the exposed resist material and the process Q8d of baking the developed resist material. In this way, the second resist having the same planar shape as the upper portion 62 of the partition 6 is formed.

After the formation of the second resist, of the upper layer 62a, the portion exposed from the second resist is removed by etching (process Q9). Further, of the lower layer 61a, the portion exposed from the second resist is removed by etching (process Q10). In this etching, the width of the lower layer 61a is made less than that of the upper portion 62, thereby forming the lower portion 61.

Subsequently, the second resist is removed (process Q11). The display elements DE1, DE2 and DE3 are formed by a procedure similar to that of FIG. 8A to FIG. 8E (process Q12). The resin layer 13, the sealing layer 14 and the resin layer 15 are formed (process Q13).

As described above, in the manufacturing method of the comparative example, the first resist for patterning the rib layer 5a which is the base of the rib 5 and the second resist for patterning the lower and upper layers 61a and 62a which are the base of the partition 6 are separate bodies formed by individual photolithographic processes (processes Q3a, Q3b, Q3c and Q3d and processes Q8a, Q8b, Q8c and Q8d). In this case, there is a possibility that the first resist and the second resist deviate from the design positions because of the misalignment of the exposure position at the time of forming the first resist or the misalignment of the exposure position at the time of forming the second resist. If the first resist or the second resist deviates from the design position, the positions of the rib 5 and the partition 6 are also relatively misaligned.

Figure 10:
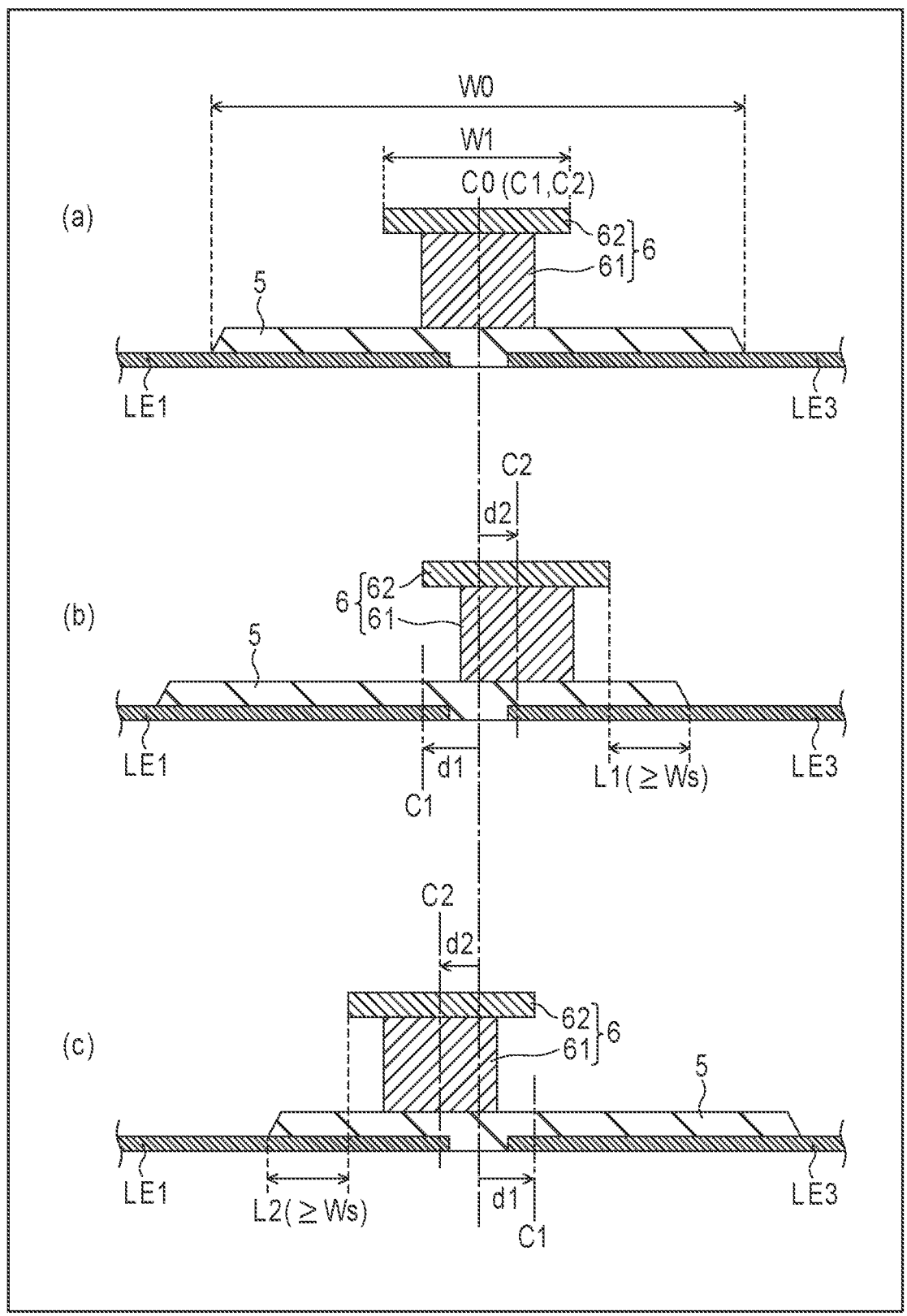
FIG. 10 is a diagram for explaining a misalignment which could be caused when the rib and the partition are formed by the manufacturing method of the comparative example.

FIG. 10 is a diagram for explaining a misalignment which could be caused when the rib 5 and the partition 6 are formed by the manufacturing method of the comparative example. Here, it is assumed that, when the rib 5 and the partition 6 are formed as designed, the center C1 of the rib 5 is coincident with the center C2 of the partition 6 at position C0. In a manner similar to that of the example of FIG. 5, the width of the rib 5 is W0. The width of the upper portion 62 of the partition 6 is W1. The width of the shadow area As is Ws.

In FIG. 10(a), the rib 5 or the partition 6 is not misaligned, and both center C1 and center C2 are coincident with position C0.

In FIG. 10(b), center C1 deviates from position C0 to the left side by distance d1, and center C2 deviates from position C0 to the right side by distance d2.

In FIG. 10(c), center C1 deviates from position C0 to the right side by distance d1, and center C2 deviates from position C0 to the left side by distance d2.

Here, distance d1 is assumed to be the maximum amount of deviation which could be caused at the time of forming the rib 5 from position C0. Distance d2 is assumed to be the maximum amount of deviation which could be caused at the time of forming the partition 6 from position C0. In this case, FIG. 10(b) corresponds to a state in which the partition 6 deviates to the right side with respect to the rib 5 to the maximum extent. FIG. 10(c) corresponds to a state in which the partition 6 deviates to the left side with respect to the rib 5 to the maximum extent.

The width W0 of the rib 5 needs to be determined such that the entire shadow area As is located on the rib 5 in the states of FIG. 10(b) and FIG. 10(c). Therefore, in the state of FIG. 10(b), the distance L1 between the partition 6 and the right end of the rib 5 has to be greater than or equal to the width Ws of the shadow area As. In the state of FIG. 10(c), the distance L2 between the partition 6 and the left end of the rib 5 also has to be greater than or equal to width Ws. In consideration of the above matters, width W0 is determined so as to satisfy the following condition (2).

$$W0 \geq W1 + Ws \times 2 + (d1+d2) \times 2 \qquad (2)$$

If width W0 is increased to satisfy this condition, the pixel apertures AP1, AP2 and AP3 are made small. In this case, as the areas of the light emission of the display elements DE1, DE2 and DE3 are made small, the luminances of the display elements DE1, DE2 and DE3 are decreased. The luminances of the display elements DE1, DE2 and DE3 can be increased by supplying a high current to the display elements DE1, DE2 and DE3. However, in this case, the degradation of the display elements DE1, DE2 and DE3 is accelerated, and the life of these display elements is shortened. Thus, in the manufacturing method of the comparative example, it is difficult to improve both the display quality and the reliability of the display device.

In the manufacturing method of the present embodiment, as shown in FIG. 7A to FIG. 7F, both the rib 5 and the partition 6 are formed using the resist R1. In this case, the relative misalignment of the rib 5 and the partition 6 shown in the comparative example is difficult to cause. Thus, it is possible to determine width W0 by the condition (1) described above.

When width W0 is determined by the condition (1), the pixel apertures AP1, AP2 and AP3 can be made large compared to the structure of the comparative example. In this case, the luminances of the display elements DE1, DE2 and DE3 are improved compared to the comparative example. If the pixel apertures AP1, AP2 and AP3 are made large while maintaining the luminances of the display elements DE1, DE2 and DE3 so as to be equal to those of the comparative example, the current densities of the display elements DE1, DE2 and DE3 are decreased. In this case, the life of the display elements DE1, DE2 and DE3 can be lengthened.

As a method for forming the display elements of organic EL display devices, the display elements of respective colors may be formed in series using a metal mask without providing the partition 6. In this case, in consideration of the misalignment between the metal mask and the substrate, the rib 5 needs to be formed so as to be wider than that of the present embodiment and the comparative example. To the contrary, when the rib 5, the partition 6 and the display elements DE1, DE2 and DE3 are formed by the method of the present embodiment, the width of the rib 5 can be largely reduced. Thus, for example, even a high-definition display device with a resolution greater than or equal to 1500 ppi can be manufactured.

Second Embodiment

A second embodiment is explained. The second embodiment is different from the first embodiment in terms of the manufacturing method of the display device DSP. The configuration of the display device DSP is the same as the first embodiment.

Figure 11:
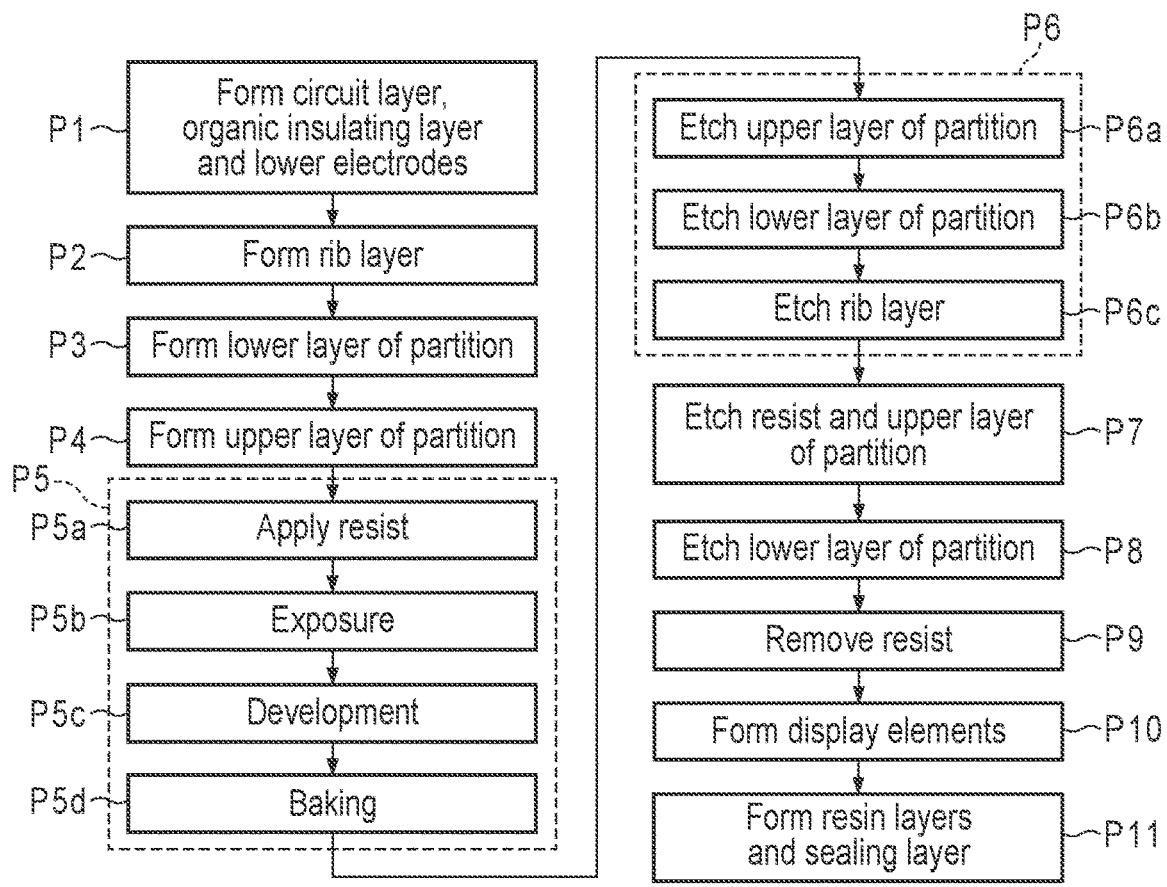
FIG. 11 is the flowchart of the manufacturing method of a display device according to a second embodiment.

FIG. 11 is the flowchart of the manufacturing method of a display device DSP according to the second embodiment. FIG. 12A to FIG. 12E are schematic cross-sectional views showing a process for forming a rib 5 and a partition 6 according to the second embodiment.

Figure 12A:
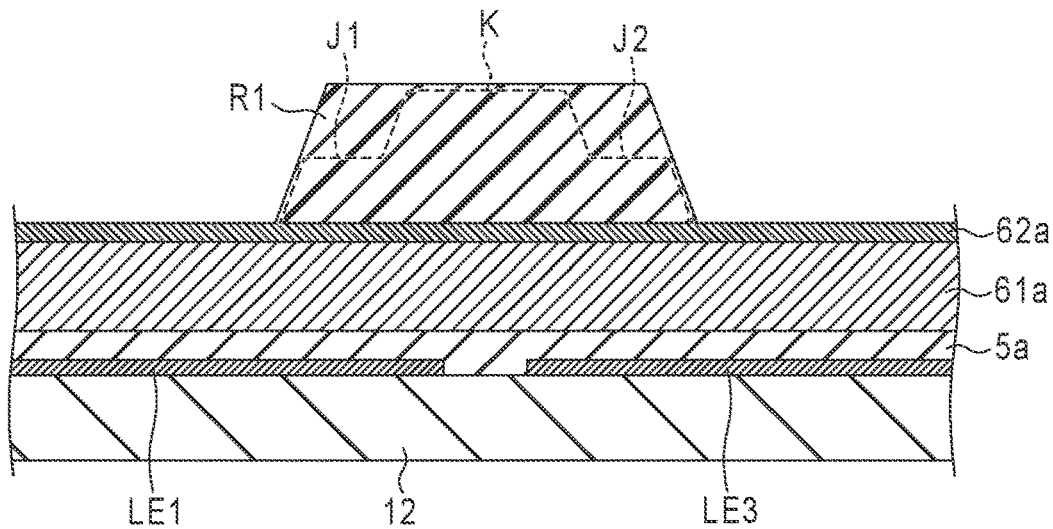
FIG. 12A is a schematic cross-sectional view showing a process for forming a rib and a partition according to the second embodiment.

First, in a manner similar to that of the first embodiment, a circuit layer 11, an organic insulating layer 12 and lower electrodes LE1, LE2 and LE3 are formed (process P1). Further, as shown in FIG. 12A, a rib layer 5a is formed (process P2). A lower layer 61a is formed (process P3). An upper layer 62a is formed (process P4). A resist R1 is formed (process P5). The process P5 of forming the resist R1 includes processes P5a, P5b, P5c and P5d in a manner similar to that of the first embodiment.

Figure 12B:
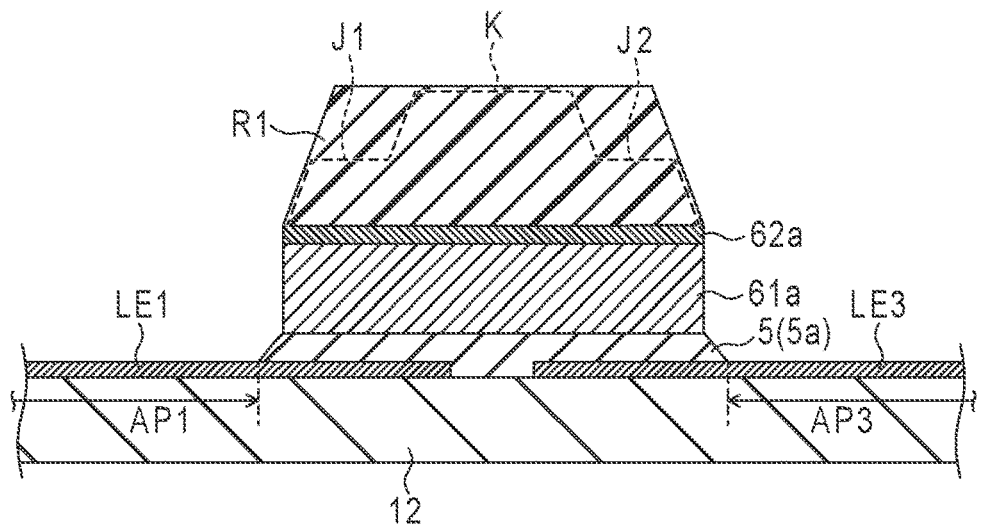
FIG. 12B is a schematic cross-sectional view showing a process following FIG. 12A.

Subsequently, a first etching process P6 is performed, and as shown in FIG. 12B, of the upper layer 62a, the lower layer 61a and the rib layer 5a, the portions exposed from the resist R1 are removed. For example, the first etching process P6 includes dry etching processes P6a, P6b and P6c in a manner similar to that of the first embodiment.

Figure 12C:
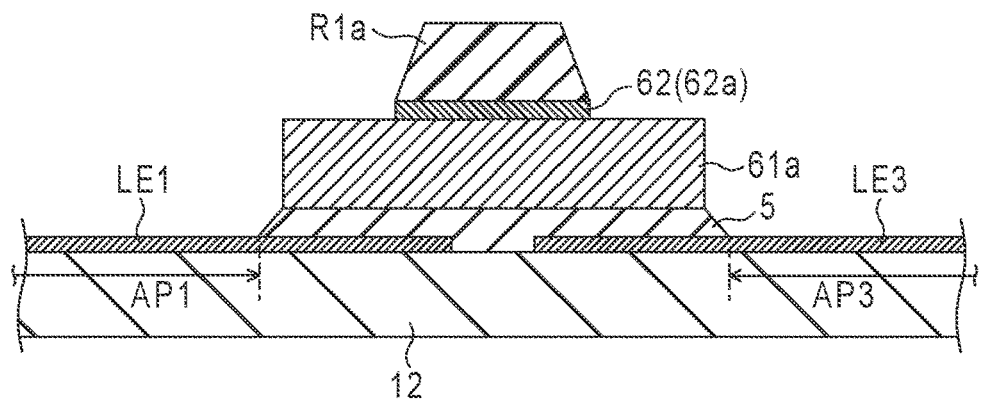
FIG. 12C is a schematic cross-sectional view showing a process following FIG. 12B.

After the first etching process P6, a second etching process P7 for reducing the widths of the resist R1 and the upper layer 62a is performed. In the present embodiment, the second etching process P7 includes fourth dry etching for reducing the widths of the resist R1 and the upper layer 62a by affecting both of them. In other words, the fourth dry etching is performed on the condition that the etch selectivity for the resist R1 and the upper layer 62a is less. As shown in FIG. 12C, the fourth dry etching allows the formation of a resist R1a in which the height and width are reduced, and an upper portion 62.

Figure 12D:
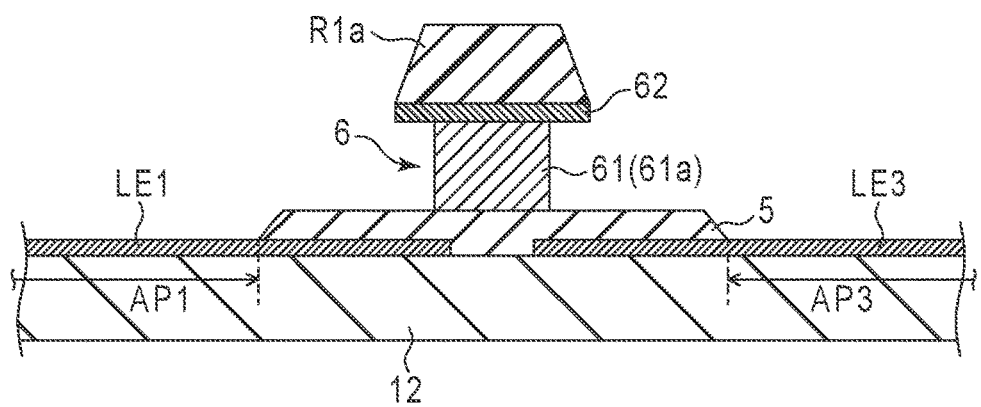
FIG. 12D is a schematic cross-sectional view showing a process following FIG. 12C.

Subsequently, by a third etching process P8 similar to that of the first embodiment, as shown in FIG. 12D, the width of the lower layer 61a is made less than that of the upper portion 62, thereby forming the lower portion 61 of the partition 6. Further, as shown in FIG. 12E, the resist R1a is removed by an exfoliation liquid (process P9).

After the formation of the rib 5 and the partition 6, display elements DE1, DE2 and DE3 are formed by a procedure similar to that of FIG. 8A to FIG. 8E (process P10). Subsequently, a resin layer 13, a sealing layer 14 and a resin layer 15 are formed (process P11).

In the manufacturing method of the embodiment described above, the widths of both the resist R1 and the upper layer 62a are reduced by the fourth dry etching. Thus, the number of etching processes can be reduced compared to the first embodiment. The display device DSP can be effectively manufactured.

To improve the accuracy of the patterning of the resist R1 and the upper layer 62a by the fourth dry etching, as shown by the broken line in FIG. 12A and FIG. 12B, the thickness of the resist R1 may partly vary. The resist R1 shown by the broken line includes a pair of thin portions J1 and J2 located in the both end portions in the width direction, and a thick portion K between the thin portions J1 and J2. The thin portions J1 and J2 can be obtained by, for example, exposing areas corresponding to the thin portions J1 and J2 with a halftone in process P5b.

When the resist R1 includes the thin portions J1 and J2, in the fourth dry etching, the thin portions J1 and J2 are preferentially lost. Thus, the amount of reduction of the width of the resist R1 can be accurately controlled. It should be noted that the thin portions J1 and J2 may be provided in the resist R1 in the first embodiment.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A manufacturing method of a display device comprising a partition including a lower portion and an upper portion, the lower portion being provided on a rib comprising a pixel aperture overlapping a display element, the upper portion protruding from a side surface of the lower portion, the method including:
    forming a lower electrode of the display element;
    forming a rib layer formed of a material of the rib on the lower electrode;
    forming a lower layer formed of a material of the lower portion on the rib layer;
    forming an upper layer formed of a material of the upper portion on the lower layer;
    forming a resist on the upper layer;
    forming the rib comprising the pixel aperture overlapping the lower electrode by removing, of the upper layer, the lower layer and the rib layer, a portion exposed from the resist by a first etching process;
    forming the upper portion by reducing widths of the resist and the upper layer by a second etching process after the first etching process; and
    forming the lower portion by making a width of the lower layer less than a width of the upper portion by a third etching process after the second etching process.

2. The manufacturing method of claim 1, wherein the first etching process includes:
    first dry etching for removing, of the upper layer, a portion exposed from the resist;
    second dry etching for removing, of the lower layer, a portion exposed from the resist; and
    third dry etching for removing, of the rib layer, a portion exposed from the resist.

3. The manufacturing method of claim 1, wherein the second etching process includes:
    ashing for reducing the width of the resist; and
    fourth dry etching for removing, of the upper layer, a portion exposed from the resist after the ashing.

4. The manufacturing method of claim 1, wherein the third etching process includes isotropic wet etching.

5. The manufacturing method of claim 1, wherein the second etching process includes fourth dry etching for reducing the widths of the resist and the upper layer by affecting both the resist and the upper layer.

6. The manufacturing method of claim 1, wherein before the second etching process is applied, the resist includes a pair of thin portions and a thick portion between the pair of thin portions.

7. The manufacturing method of claim 1, further including
    forming an organic layer and an upper electrode for constituting the display element together with the lower electrode by vapor deposition after the formation of the partition.

8. The manufacturing method of claim 7, further including
    forming a sealing layer which continuously covers the display element and the partition.

9. The manufacturing method of claim 7, wherein
    a shadow area in which a thickness decreases toward the side surface of the lower portion is formed on the rib, and
    the shadow area is entirely located on the rib and does not overlap the pixel aperture.

10. The manufacturing method of claim 9, further including
forming a cap layer including a plurality of transparent thin films which cover the upper electrode, wherein
in the shadow area, a thickness of the cap layer decreases toward the side surface of the lower portion.

* * * * *